(12) United States Patent
Simsek-Ege et al.

(10) Patent No.: US 8,969,948 B2
(45) Date of Patent: Mar. 3, 2015

(54) TUNGSTEN SALICIDE GATE SOURCE FOR VERTICAL NAND STRING TO CONTROL ON CURRENT AND CELL PILLAR FABRICATION

(71) Applicants: Fatma A. Simsek-Ege, Boise, ID (US); Krishna K. Parat, Palo Alto, CA (US)

(72) Inventors: Fatma A. Simsek-Ege, Boise, ID (US); Krishna K. Parat, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/852,988

(22) Filed: Mar. 28, 2013

(65) Prior Publication Data

US 2014/0291747 A1 Oct. 2, 2014

(51) Int. Cl.
*H01L 29/792* (2006.01)
*H01L 29/423* (2006.01)
*H01L 29/66* (2006.01)
*H01L 29/788* (2006.01)

(52) U.S. Cl.
CPC ...... *H01L 29/42324* (2013.01); *H01L 29/4234* (2013.01); *H01L 29/66825* (2013.01); *H01L 29/66833* (2013.01); *H01L 29/788* (2013.01); *H01L 29/792* (2013.01)
USPC ............................ 257/326; 257/324; 257/316

(58) Field of Classification Search
CPC ......... H01L 21/00; H01L 27/00; H01L 29/00; H01L 21/28282; H01L 27/11568; H01L 27/11578; H01L 27/11582; H01L 29/4234; H01L 29/66833; H01L 29/792; H01L 29/7926; H01L 27/11524; H01L 29/788; H01L 27/11551; H01L 27/11556; H01L 29/66825; H01L 27/11517
USPC ...... 257/315, E29.3, 324, E21.179, 257/E21.422, E21.68, E27.081, E29.309, 257/326
See application file for complete search history.

(56) References Cited

U.S. PATENT DOCUMENTS

| | | | | |
|---|---|---|---|---|
| 6,448,627 B1 * | 9/2002 | Chor | ............................ | 257/530 |
| 6,867,097 B1 * | 3/2005 | Ramsbey et al. | ............. | 438/257 |
| 7,335,938 B2 * | 2/2008 | Sakuma et al. | ............... | 257/314 |
| 2005/0199938 A1 * | 9/2005 | Sakuma et al. | ............... | 257/314 |
| 2010/0109065 A1 | 5/2010 | Oh et al. | | |
| 2010/0117141 A1 * | 5/2010 | Shin et al. | ...................... | 257/326 |
| 2010/0144133 A1 | 6/2010 | Nomura et al. | | |
| 2010/0155810 A1 * | 6/2010 | Kim et al. | ...................... | 257/316 |
| 2010/0159657 A1 * | 6/2010 | Arai et al. | ...................... | 438/268 |
| 2010/0327339 A1 | 12/2010 | Tanaka et al. | | |
| 2011/0031550 A1 | 2/2011 | Komori et al. | | |
| 2012/0075903 A1 * | 3/2012 | Watanabe et al. | ............... | 365/72 |

FOREIGN PATENT DOCUMENTS

KR 10-2013-0005434 A 1/2013
WO 2014/158413 A1 10/2014

OTHER PUBLICATIONS

International Search Report and Written Opinion received for PCT Patent Application No. PCT/US2014/016286, mailed on May 30, 2014, 11 pages.

* cited by examiner

Primary Examiner — Telly Green
(74) Attorney, Agent, or Firm — Alpine Technology Law Group

(57) ABSTRACT

A non-volatile memory device and a method for forming the non-volatile memory device are disclosed. During fabrication of the memory device, a tungsten salicide is utilized as an etch-stop layer in place of a conventionally used aluminum oxide to form channel pillars having a high aspect ratio. Use of the tungsten salicide is useful for eliminating an undesired etch-stop recess and an undesired floating gate that is formed when an Al oxide etch-stop layer is conventionally used.

10 Claims, 8 Drawing Sheets

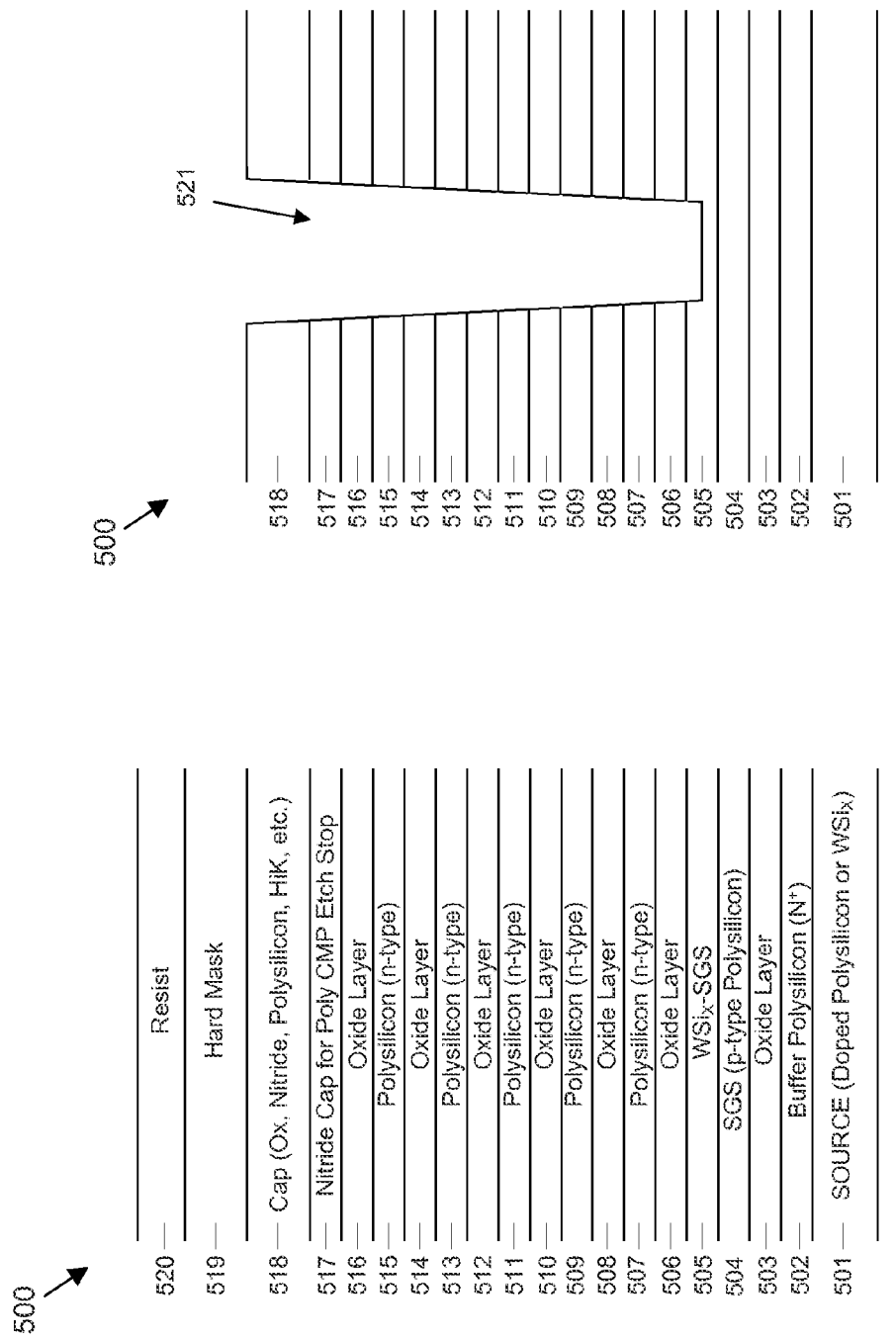

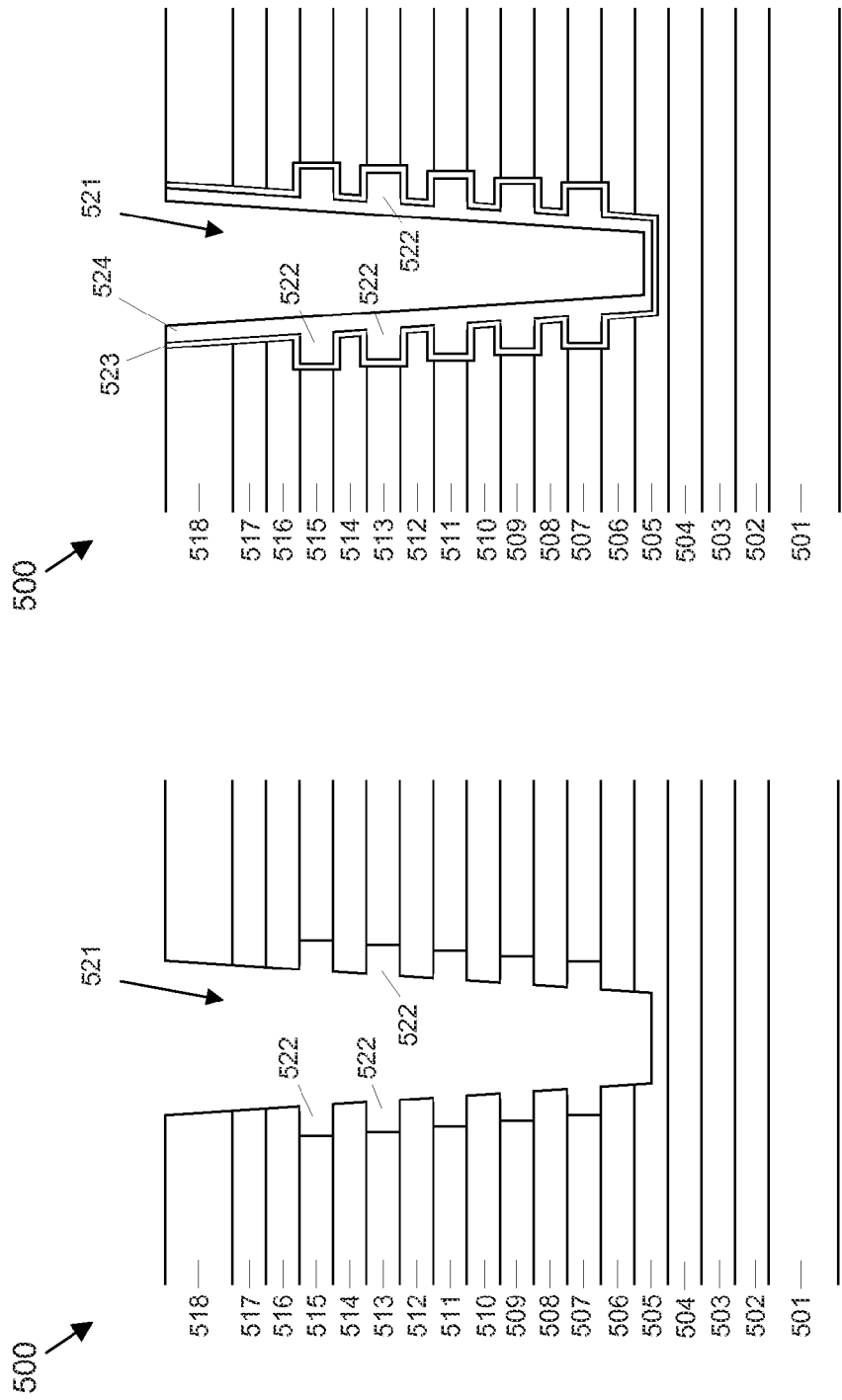

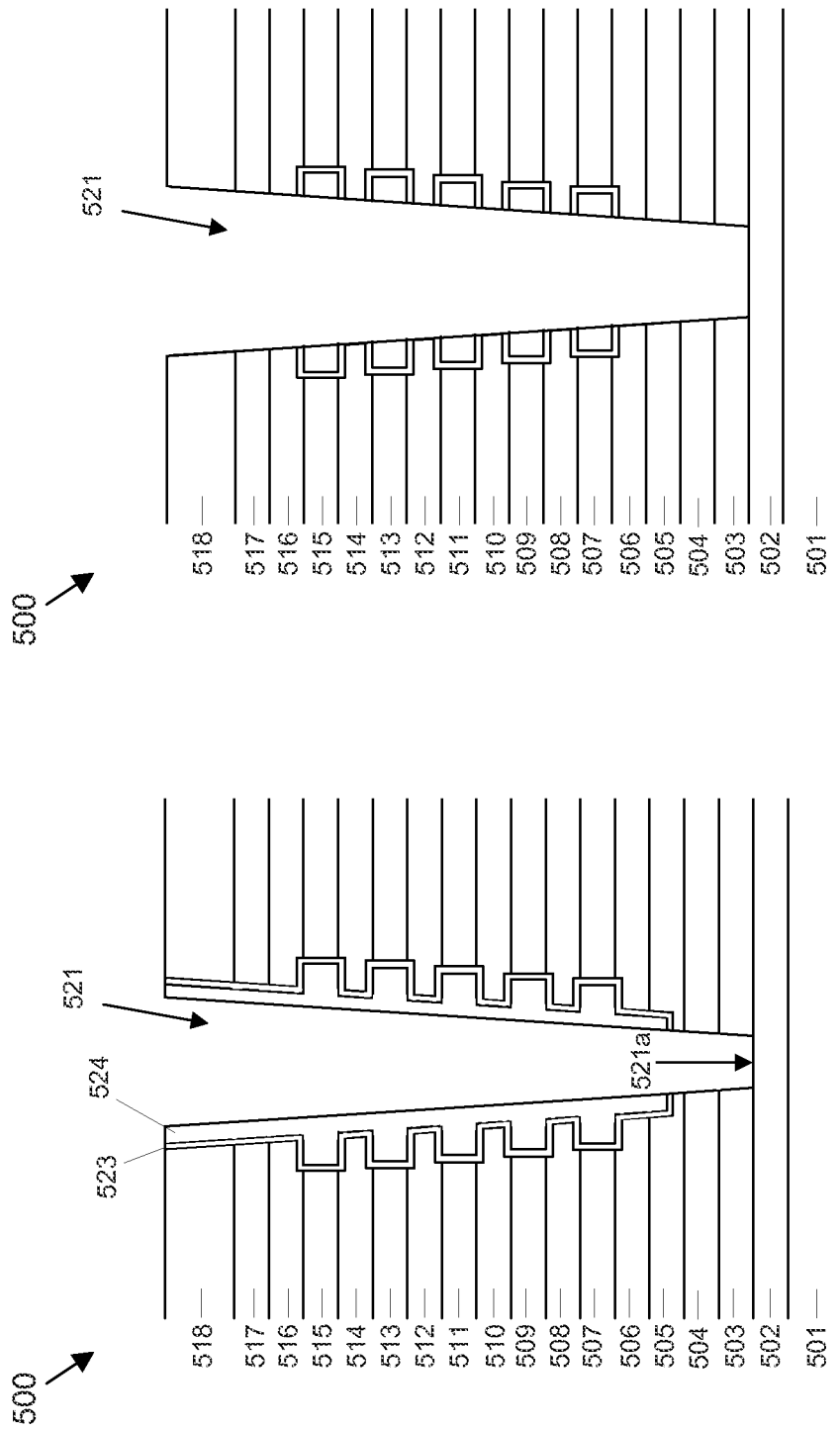

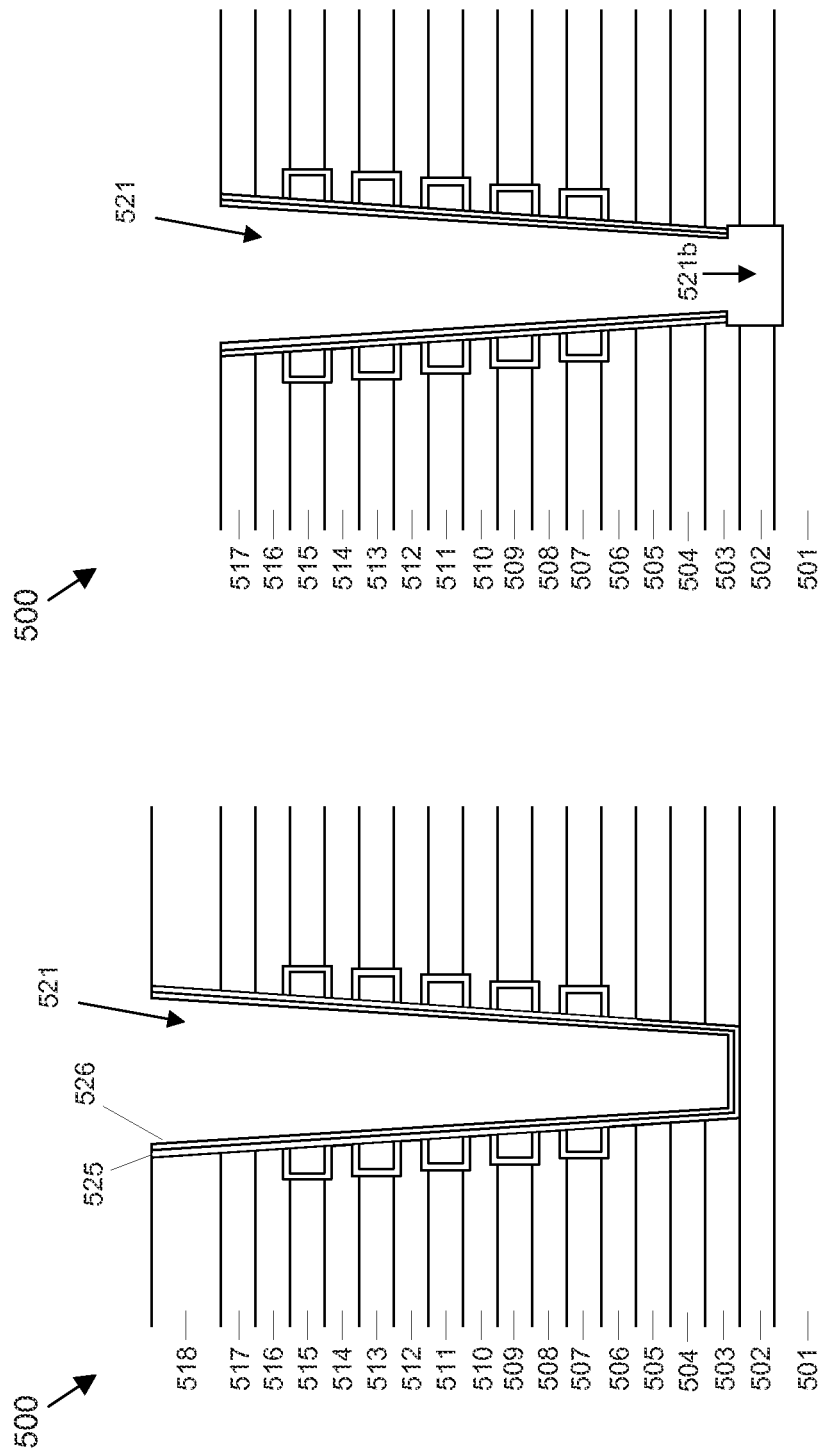

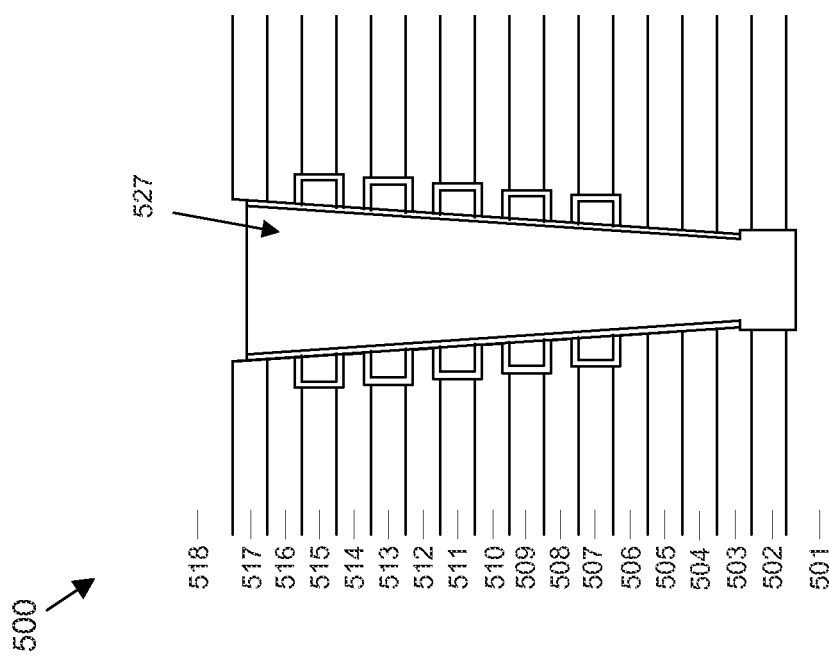

… (1)

TUNGSTEN SALICIDE GATE SOURCE FOR VERTICAL NAND STRING TO CONTROL ON CURRENT AND CELL PILLAR FABRICATION

TECHNICAL FIELD

Embodiments of techniques described herein relate to semiconductor fabrication and, more particularly, to fabricating vertical NAND strings.

BACKGROUND

A conventional vertical NAND string uses an aluminum oxide (Al oxide) etch-stop layer for stopping a high-aspect-ratio pillar (trench) etch. Because the Al oxide etch-stop layer does not have sufficient etch selectivity, a relatively thicker layer of the Al oxide is needed in order to be able to control stopping of the etch. The relatively thicker Al oxide layer causes an undesirably longer channel distance between the select gate (SG) and the first wordline (WL) of the NAND string, thereby underutilizing the full length of the NAND string channel. Additionally, the typical wet-etch cleanse chemicals, such as Hydrofluoric (HF) acid, Buffered Oxide Etch (BOE) chemistry and phosphoric acid, used for an Al oxide fast etch to clean the dry etch polymers, easily etch the Al oxide and cause a recess in the side wall of the channel at the Al oxide layer that forms an undesirable floating gate (FG), and results in an on-current degradation for the NAND string.

BRIEF DESCRIPTION OF THE DRAWINGS

Embodiments disclosed herein are illustrated by way of example, and not by way of limitation, in the figures of the accompanying drawings in which like reference numerals refer to similar elements and in which:

FIGS. 5A-5I depict various stages of the exemplary process of FIG. 4 according to the subject matter disclosed herein.

Figure 1:
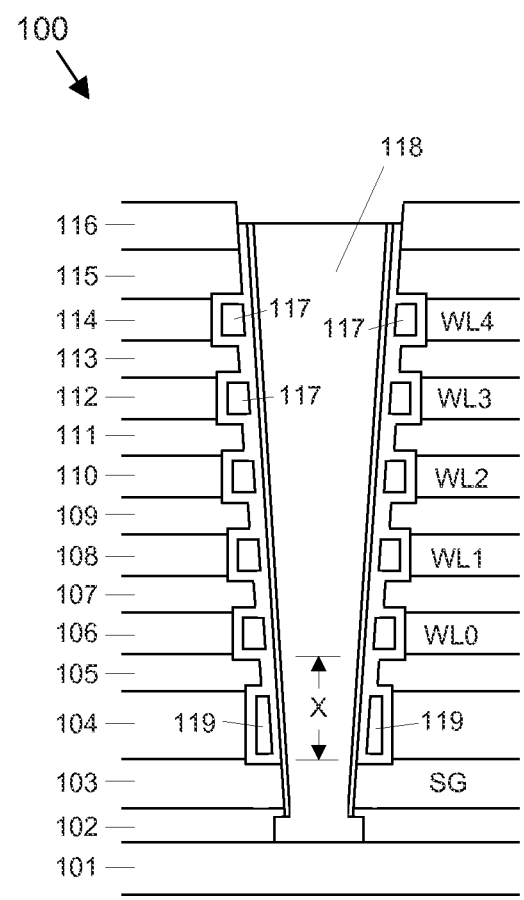
FIG. 1 depicts a side cross-sectional view of an exemplary embodiment of conventionally formed vertical NAND string during fabrication of the NAND string.

It will be appreciated that for simplicity and/or clarity of illustration, elements depicted in the figures have not necessarily been drawn to scale. For example, the dimensions of some of the elements may be exaggerated relative to other elements for clarity. The scaling of the figures does not represent precise dimensions and/or dimensional ratios of the various elements depicted herein. Further, if considered appropriate, reference numerals have been repeated among the figures to indicate corresponding and/or analogous elements.

DESCRIPTION OF THE EMBODIMENTS

Embodiments of techniques described herein relate to semiconductor fabrication and, more particularly, to fabricating vertical NAND strings. In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments. Additionally, the word "exemplary" is used herein to mean "serving as an example, instance, or illustration." Any embodiment described herein as "exemplary" is not to be construed as necessarily preferred or advantageous over other embodiments.

Various operations may be described as multiple discrete operations in turn and in a manner that is most helpful in understanding the claimed subject matter. The order of description, however, should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

FIG. 1 depicts a side cross-sectional view of an exemplary embodiment of conventionally formed vertical NAND string 100 during fabrication of the NAND string. At the particular point of fabrication depicted in FIG. 1, vertical NAND string 100 comprises a source 101, a first oxide layer 102, a select gate source (SGS) layer 103 formed from a p-type polysilicon material, an aluminum-oxide (Al oxide) etch-stop layer 104, a second oxide layer 105, a first n-type polysilicon layer 106, a third oxide layer 107, a second n-type polysilicon layer 108, a fourth oxide layer 109, a third n-type polysilicon layer 110, a fifth oxide layer 111, a fourth n-type polysilicon layer 112, a sixth oxide layer 113, a fifth n-type polysilicon layer 114, a seventh oxide layer 115, and a chemical-mechanical planarization (CMP) layer 116, such as a silicon nitride layer. Vertical NAND string 100 also includes a plurality of individual flash cells 117 (of which only a few flash cells 117 are indicated in FIG. 1), and a polysilicon channel 118.

Polysilicon layer 106 of NAND string 100 will become wordline WL0. Similarly, polysilicon layers 108, 110, 112 and 114 will respectively become wordlines WL1-WL4. It should be understood that for clarity of FIG. 1 not all of the structures comprising vertical NAND string 100 are indicated. It should also be understood that polysilicon layers 106, 108, 110, 112 and 114 could alternatively be formed from a p-type polysilicon material. Additionally, it should be understood that the depicted various layers and structures of vertical NAND string 100 are formed in a well-known manner.

When a dielectric etch-stop layer 104 is conventionally used during fabrication of vertical NAND string 100, an undesirably large distance X is created between the select gate source (SGS) 103 and the first wordline (WL0) 106. For example, if a distance X is less than 50 nm is desired for the distance between the select gate SG 103 and WL0 106, the conventional technique of using an Al oxide etch-stop layer 104 may be unacceptable because it results in a SG-to-WL0 distance X that is greater than the desired 50 nm because the process control for the pillar etch needs more than a 45 nm Al oxide thickness. Additionally, process control requires a 20 nm tetraethyl orthosilicate (TEOS) oxide, which is deposited by chemical vapor deposition (CVD). The wet-etch rate for Al oxide layer 104 is too fast for the desired distance between SG 103 and WL0 106. Moreover, because the pillar-etch process has a high polymerization rate in order to achieve a high-aspect-ratio etch for channel 118, the options for a subsequent wet cleanse are limited. Additionally, a recess in the Al oxide of the channel sidewall of about 7 nm is unavoidably formed during pillar wet-etch cleanse. The recess forms an undesirable floating gate (FG) 119 in Al oxide etch-stop layer 104 that adversely impacts the "on" current for device 100. That is, the on current follows the sidewalls of the channel, and an Al oxide recess—or the presence of a floating gate in the Al oxide region—changes the current path. This and/or the increase in distance X makes it harder to turn on and control the vertical NAND string.

Figure 2:
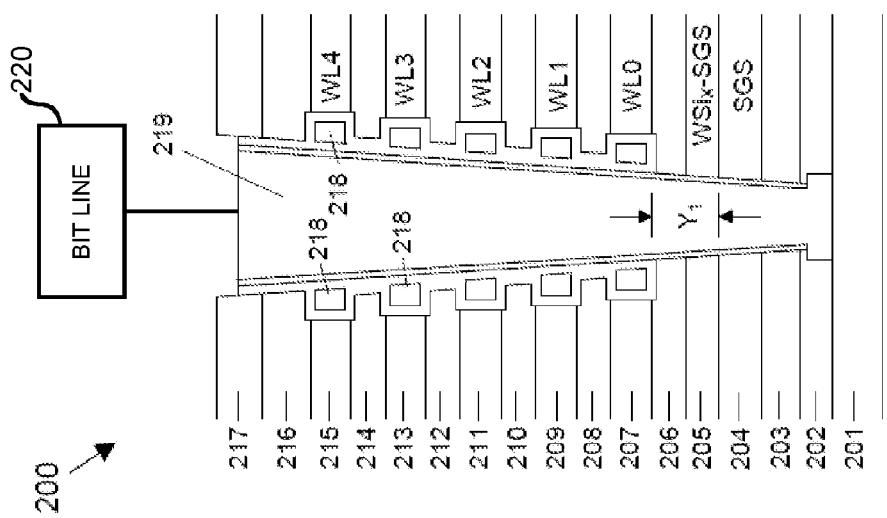
FIG. 2 depicts a side cross-section view of a first exemplary embodiment of vertical NAND string during fabrication according to the subject matter disclosed herein.

FIG. 2 depicts a side cross-section view of a first exemplary embodiment of vertical NAND string 200 during fabrication according to the subject matter disclosed herein. In one exemplary embodiment, vertical NAND string 200 could form part of an array of NAND strings for, for example, a solid-state memory or a solid-state drive (SSD). At the particular point of fabrication depicted in FIG. 2, vertical NAND string 200 comprises a source 201, a doped polysilicon buffer layer 202, a first oxide layer 203, a select gate source (SGS) layer 204 formed from a p-type polysilicon material, a tungsten salicide (WSi$_X$) layer 205, a second oxide layer 206, a first n-type polysilicon layer 207, a third oxide layer 208, a second n-type polysilicon layer 209, a fourth oxide layer 210, a third n-type polysilicon layer 211, a fifth oxide layer 212, a fourth n-type polysilicon layer 213, a sixth oxide layer 214, a fifth n-type polysilicon layer 215, a seventh oxide layer 216, and a chemical-mechanical planarization (CMP) layer 217, such as, but not limited to, a silicon-nitride layer. Vertical NAND string 200 also includes a plurality of individual flash cells 218 (of which only a few flash cells are indicated in FIG. 2), and a polysilicon channel 219. The end of polysilicon channel 219 opposite source 201 will eventually be coupled to a bit line (BL) 220.

In the exemplary embodiment depicted in FIG. 2, polysilicon 207 will become wordline WL0. Similarly, polysilicon layers 209, 211, 213 and 215 will respectively become wordlines WL1-WL4. It should be understood that for clarity of FIG. 2 not all of the structures comprising vertical NAND string 200 are indicated. It should also be understood that polysilicon layers 207, 209, 211, 213 and 215 could be formed from a p-type polysilicon material. Further, it should be understood that the depicted various layers and structures of vertical NAND string 200 are formed in a well-known manner. Additionally, the subject matter disclosed herein is not limited to floating gate (FG) vertical NAND devices, but is also applicable to other vertical transistor architectures, such as Charge Trap Flash (CTF) NAND devices, and can enhance performance in stacked pillar vertical NAND scaling approaches, such as, but not limited to, solid-state memory or solid-state drives (SSDs).

In the exemplary embodiment depicted in FIG. 2, WSi$_X$ layer 205 can be formed to be about 20 nm thick and can be used as an etch-stop layer to form pillars (i.e., channels) having an aspect ratio of about 30:1. Accordingly, WSi$_X$ layer 205 becomes part of select gate (SGS) 204, and the SGS-to-WL0 distance Y$_1$ is reduced to be about 30 nm, which also reduces the on current for device 200. Further still, the undesired etch-stop recess and undesired floating gate formed when an Al oxide etch-stop layer is conventionally used (i.e., FIG. 1) is virtually eliminated because WSi$_X$ layer 205 is compatible with the IPD sidewall removal techniques that are used to form flash cells 218.

Figure 3:
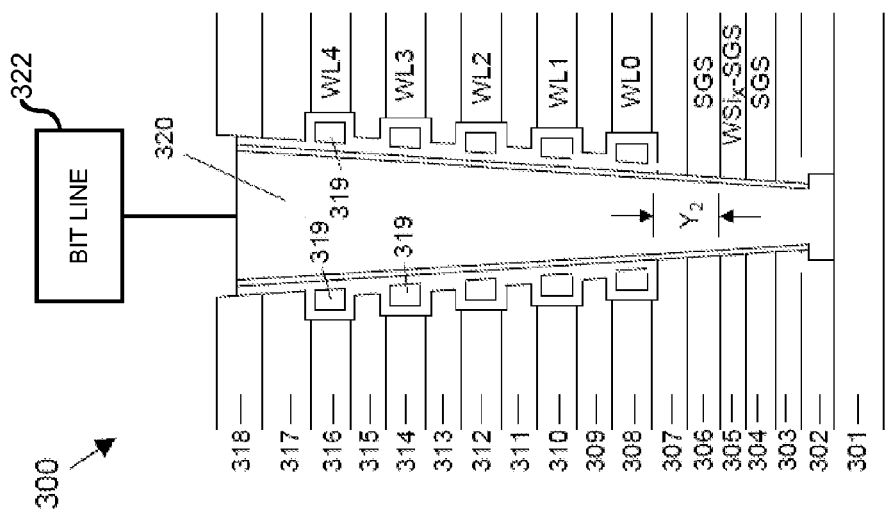
FIG. 3 depicts a side cross-section view of a first exemplary embodiment of vertical NAND string during fabrication according to the subject matter disclosed herein.

FIG. 3 depicts a side cross-section view of a first exemplary embodiment of vertical NAND string 300 during fabrication according to the subject matter disclosed herein. In one exemplary embodiment, vertical NAND string 300 could form part of an array of NAND strings for, for example, a solid-state memory or a solid-state drive (SSD). At the point of fabrication depicted in FIG. 3, vertical NAND string 300 comprises a source 301, an n$^+$-type polysilicon buffer layer 302, a first oxide layer 303, a first select gate source (SGS) layer 304 formed from a p-type polysilicon material, a tungsten salicide (WSi$_X$) layer 305, a second select gate (SGS)) layer 306 formed from a p-type polysilicon material, a second oxide layer 307, a first n-type polysilicon layer 308, a third oxide layer 309, a second n-type polysilicon layer 310, a fourth oxide layer 311, a third n-type polysilicon layer 312, a fifth oxide layer 313, a fourth n-type polysilicon layer 314, a sixth oxide layer 315, a fifth n-type polysilicon layer 316, a seventh oxide layer 317, and a chemical-mechanical planarization (CMP) layer 318, such as, but not limited to, a silicon-nitride layer. Vertical NAND string 300 also includes a plurality of individual flash cells 319 (of which only a few flash cells 319 are indicated in FIG. 3), and a polysilicon channel 320. The end of polysilicon channel 320 opposite source 301 will eventually be coupled to a bit line (BL) 322.

In the exemplary embodiment depicted in FIG. 3, polysilicon 308 will become wordline WL0. Similarly, polysilicon layers 310, 312, 314 and 316 will respectively become wordlines WL1-WL4. It should be understood that for clarity of FIG. 3 not all of the structures comprising vertical NAND string 300 are indicated. It should also be understood that polysilicon layers 308, 310, 312, 314 and 316 could be formed from a p-type polysilicon material. Further, it should be understood that the depicted various layers and structures of vertical NAND string 300 are formed in a well-known manner. Additionally, the subject matter disclosed herein is not limited to floating gate (FG) vertical NAND devices, but is also applicable to other vertical transistor architectures, such as Charge Trap Flash (CTF) NAND devices, and can enhance performance in stacked pillar vertical NAND scaling approaches, such as, but not limited to, solid-state memory or solid-state drives (SSDs).

In the exemplary embodiment depicted in FIG. 3, WSi$_X$ layer 305 is formed between first SGS layer 304 and second SGS layer 306, and provides all of the benefits provided by exemplary embodiment 200 depicted in FIG. 2. That is WSi$_X$ layer 305 can be formed to be about 20 nm thick and used as an etch-stop layer for forming pillars (i.e., channels) having an aspect ratio of about 30:1. Accordingly, WSi$_X$ layer 305 becomes part of SGSs 304 and 306, and the SGS-to-WL0 distance Y$_2$ is reduced to be about 30 nm. Further still, the undesired etch-stop recess and undesired floating gate formed when an Al oxide etch-stop layer is conventionally used (FIG. 1) is virtually eliminated because WSi$_X$ layer 305 is compatible with the IPD sidewall removal techniques that are used to form flash cells 319. Additionally, because WSi$_X$ layer 305 for this exemplary embodiment is formed between two polysilicon layers, the interface adhesion between the surfaces of WSi$_X$ layer 305 and SG layers 304 and 306 is stronger than the interface adhesion between WSi$_X$ layer 205 and second oxide layer 206 of exemplary embodiment 200 (FIG. 2).

Figure 4:
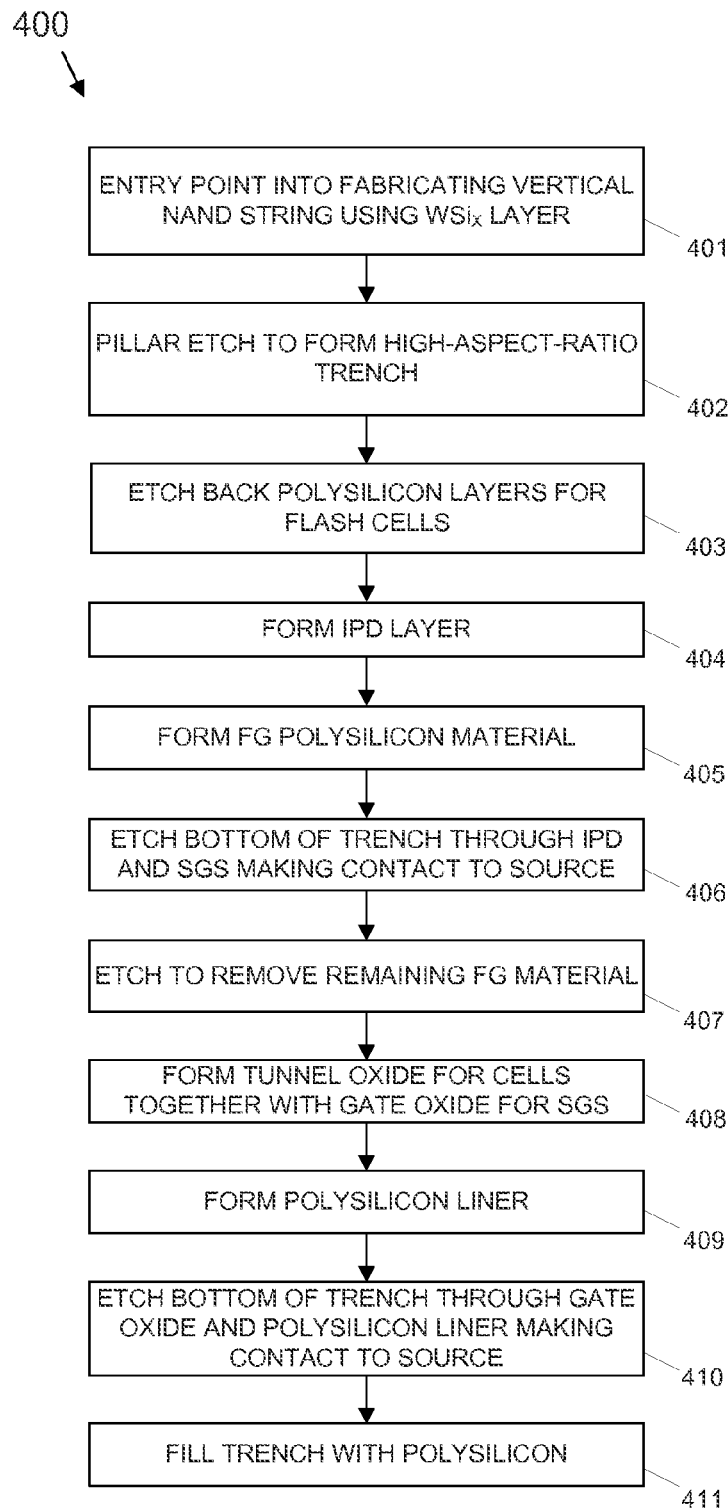
FIG. 4 depicts a flow diagram for an exemplary process for forming the exemplary embodiment of a vertical NAND string of FIG. 2 according to the subject matter disclosed herein.

FIG. 4 depicts a flow diagram for an exemplary process 400 for forming a vertical NAND string 200 (FIG. 2) according to the subject matter disclosed herein. FIGS. 5A-5I depict the various stages of exemplary process 400.

Block 401 in FIG. 4 represents an exemplary entry point into process 400. FIG. 5A depicts one exemplary entry point for fabricating an embodiment 500 of the exemplary vertical NAND string depicted in FIG. 2. As shown in FIG. 5A, the various layers have been deposited using a well-known manner. In particular, device 500 comprises a source layer 501 formed from a doped polysilicon material layer or from a $WSi_X$ material layer. An $n^+$-type buffer polysilicon material layer 502 is formed on source layer 501 if the source material 501 is formed from $WSi_X$. If source material 501 is formed from a doped-polysilicon, buffer layer 502 is not needed. A first oxide layer 503 is formed on buffer polysilicon layer 502. Suitable materials for oxide layer 503 include, but are not limited to, TEOS oxide, and a High-Aspect Ratio Process (HARP) oxide film, such as ozone/tetraethyl orthosilicate ($O_3$/TEOS). A select source gate (SGS) layer 504 is formed on first oxide layer 503. A $WSi_X$-SGS layer 505 is formed on SGS layer 504. (At this point, if an embodiment of the exemplary vertical NAND string depicted in FIG. 3 is desired, a second SGS layer would be formed on $WSi_X$-SGS layer 505.)

Returning to the exemplary entry point (block 401) of the process of FIG. 4 and device 500 of FIG. 5A, a second oxide layer 506 is formed on $WSi_X$ layer 505, and a first n-type polysilicon layer 507 is formed on oxide layer 506. Alternating layers of oxide and n-type polysilicon are formed depending on the number of flash cells that the vertical NAND string will comprise. The exemplary vertical NAND string depicted in FIGS. 5A-5I will have five flash cells, so oxide layers 508, 510, 512 and 514 and n-type polysilicon layers 509, 511, 513 and 515 are alternatingly formed on oxide layer 506. It should be understood that embodiments of a vertical NAND string according to the subject matter disclosed herein can have more or less flash cells than five flash cells. An oxide layer 516 is formed on n-type polysilicon layer 515. A nitride cap layer 517 is formed on oxide layer 516. An oxide cap layer 518 is formed on nitride cap layer 517. A hard mask layer 519, such as carbon, is formed on oxide cap layer 518, and a resist layer 520 is formed on hard mask layer 519. In alternative embodiments, cap layer 518 could be formed from a nitride material, a polysilicon material or a Hi-K dielectric material.

In FIG. 5B, a pillar etch (block 402 in FIG. 4) is performed in a well-known manner that stops in $WSi_X$ layer 505 to form a high-aspect-ratio trench 521 that will eventually become the channel of device 500. FIG. 5B also shows hard mask layer 519 and resist layer 520 removed. Although device 500 will have only five tiers of flash cells, it should be understood that the subject matter disclosed herein is not so limited and can have many more tiers (approximately 40) of flash cells.

In FIG. 5C, a tetramethylammonium hydroxide (TMAH) etch is performed (block 403) in trench 521 to etch back the n-type polysilicon layers 507, 509, 511, 513 and 515 at 522, of which only a few locations are indicated for clarity of FIG. 5C. $WSi_X$ layer 505 is unaffected by the TMAH etch, thereby avoiding the undesired etch-stop recess and floating gate that are formed when an Al oxide etch-stop layer is conventionally used for forming a vertical NAND string. In FIG. 5D, an Inter Poly Dielectric (IPD) material 523 is formed (block 404) in a well-known manner in trench 521 and etched-back locations 522. A floating gate (FG) polysilicon material 524 is formed (block 405) to fill etched-back locations 523.

In FIG. 5E, a well-known dry-etch technique is performed (block 406) to etch the bottom 521a of trench 521 through IPD material 523, polysilicon material 524 and $WSi_X$ layer 505, stopping in oxide layer 503, just above buffer polysilicon layer 502. In FIG. 5F, a well-known wet-etch technique is performed (block 407) that removes any remaining FG polysilicon material 523 from trench 521 to prevent any WL-to-WL shorts. Additionally, IPD material 523 is removed using a well-known silicon-nitride etchant. $WSi_X$ layer 505 remains intact, whereas in a conventional process, the Al oxide does not remain intact and an undesired etch-stop recess and an undesired floating gate would be formed.

In FIG. 5G, a tunnel oxide layer 525 is formed (block 408) in a well-known manner in trench 521. A suitable material for tunnel oxide layer 525 includes, but is not limited to, a High-Temperature Oxide (HTO) deposited by a well-known rapid thermal CVD (RTCVD) process. A polysilicon liner 526 is then formed (block 409) on tunnel oxide layer 525 to protect the tunnel oxide layer from a subsequent etch that clears oxide layer 502 and polysilicon liner 526 from the bottom of trench 521. In FIG. 5H, the subsequent dry etch removes polysilicon liner 526 (block 410) and clears oxide layer 502 and polysilicon liner 526 from the bottom of trench 521b, while also removing CAP layer 518 from the top of device 500. Additionally, for better channel continuity, another etching (post punch cleanse) cleanses is performed to remove any remaining SGS oxide between the channel and source layer 501 so that the channel makes an electrical contact to source layer 501.

In FIG. 5I, trench 521 is filled in a well-known manner (block 411) with polysilicon 527 to form a channel, and a well-known poly CMP technique is used to remove excess polysilicon from the channel.

These modifications can be made in light of the above detailed description. The terms used in the following claims should not be construed to limit the scope to the specific embodiments disclosed in the specification and the claims. Rather, the scope of the embodiments disclosed herein is to be determined by the following claims, which are to be construed in accordance with established doctrines of claim interpretation.

The invention claimed is:

1. A memory device, comprising:
    a channel comprising a first end and a second end, the first end of the channel being coupled to a bit line and the second end of the channel being coupled to a source;
    a select gate formed at the second end of the channel to selectively control conduction between the bit line and the channel, the select gate comprising a layer of tungsten salicide;
    at least one non-volatile memory cell formed along a length of the channel between the select gate and the first end of the channel; and
    at least one word line coupled to the at least one non-volatile memory cell;
    wherein a distance between the select gate and the at least one word line is reduced with respect to a memory device having a select gate comprising aluminum oxide.

2. The memory device according to claim 1, wherein the at least one non-volatile memory cell comprises a floating-gate (FG) memory cell or a charge trap flash (CTF) memory cell.

3. The memory device according to claim 1, wherein the memory device comprises part of a solid-state drive (SSD).

4. The memory device according to claim 1, wherein the memory device comprises part of an array of memory devices.

5. The memory device according to claim 1, wherein the select gate comprises a layer of tungsten salicide formed between two polysilicon layers.

6. A memory device, comprising:
- a channel comprising a first end and a second end, the first end of the channel being coupled to a bit line and the second end of the channel being coupled to a source;
- a select gate formed at the second end of the channel to selectively control conduction between the bit line and the channel, the select gate comprising a layer of tungsten salicide;
- the select gate being adjacent to a layer of polysilicon;
- at least one non-volatile memory cell formed along a length of the channel between the select gate and the first end of the channel; and
- at least one word line coupled to the at least one non-volatile memory cell;
- wherein a distance between the select gate and the at least one word line is reduced with respect to a memory device having a select gate comprising aluminum oxide.

7. The memory device according to claim 6, wherein the at least one non-volatile memory cell comprises a floating-gate (FG) memory cell or a charge trap flash (CTF) memory cell.

8. The memory device according to claim 6, wherein the memory device comprises part of a solid-state drive (SSD).

9. The memory device according to claim 6, wherein the memory device comprises part of an array of memory devices.

10. The memory device according to claim 6, wherein the select gate comprises a layer of tungsten salicide formed between two polysilicon layers.

* * * * *